United States Patent [19]

Kardokus et al.

[11] Patent Number: 5,863,398
[45] Date of Patent: Jan. 26, 1999

[54] HOT PRESSED AND SINTERED SPUTTERING TARGET ASSEMBLIES AND METHOD FOR MAKING SAME

[75] Inventors: Janine K. Kardokus, Otis Orchards; Diana Morales, Veradale, both of Wash.

[73] Assignee: Johnson Matthey Electonics, Inc., Spokane, Wash.

[21] Appl. No.: 729,505

[22] Filed: Oct. 11, 1996

[51] Int. Cl.$^6$ .......................... B23K 20/00; C23C 14/34
[52] U.S. Cl. .................. 204/298.13; 228/194; 228/208; 419/8
[58] Field of Search ................................. 228/194, 208; 148/527; 419/8, 6; 204/298.13

[56] References Cited

U.S. PATENT DOCUMENTS

| | | | |
|---|---|---|---|
| 2,940,163 | 6/1960 | Davies | 419/6 |
| 3,657,801 | 4/1972 | Hershenson | 228/194 |
| 4,468,313 | 8/1984 | Okumura et al. | 204/298 |
| 4,610,774 | 9/1986 | Sakata et al. | 204/298 |
| 4,752,335 | 6/1988 | Korb | 75/249 |
| 4,820,397 | 4/1989 | Fielder et al. | 204/298 |
| 4,826,584 | 5/1989 | dos Santos Pereiro Ribeiro | 204/298 |
| 4,838,935 | 6/1989 | Dunlop et al. | 75/230 |
| 4,889,772 | 12/1989 | Bergmann et al. | 428/547 |
| 4,961,831 | 10/1990 | Bergmann et al. | 204/192.16 |
| 4,961,832 | 10/1990 | Shagun et al. | 204/298.07 |
| 4,963,239 | 10/1990 | Shimamura et al. | 204/192.12 |
| 4,963,240 | 10/1990 | Fukasawa et al. | 204/192.15 |
| 4,964,962 | 10/1990 | Nobutani et al. | 204/192.3 |
| 4,964,968 | 10/1990 | Arita | 204/298.19 |
| 4,964,969 | 10/1990 | Kusakabe et al. | 204/298.12 |
| 4,966,676 | 10/1990 | Fukasawa et al. | 204/298.12 |
| 4,966,677 | 10/1990 | Aichert et al. | 204/298.21 |
| 4,971,674 | 11/1990 | Hata | 204/192.12 |
| 5,066,381 | 11/1991 | Ohta et al. | 204/298.12 |
| 5,230,459 | 7/1993 | Mueller et al. | 228/164 |
| 5,282,943 | 2/1994 | Lannutti et al. | 228/208 |
| 5,397,050 | 3/1995 | Mueller | 228/193 |
| 5,522,535 | 6/1996 | Ivanov et al. | 228/194 |
| 5,693,203 | 12/1997 | Ohhashi et al. | 204/298.13 |

FOREIGN PATENT DOCUMENTS

| | | | |
|---|---|---|---|
| 370211 | 5/1990 | European Pat. Off. . | |
| 0575166 | 12/1993 | European Pat. Off. | 204/298.13 |
| 0590904 | 4/1994 | European Pat. Off. | 204/298.13 |
| 63-157102 | 6/1988 | Japan . | |
| 63-270459 | 8/1988 | Japan . | |
| 1283367 | 11/1989 | Japan | 204/298.12 |
| 1301855 | 12/1989 | Japan | 204/298.12 |
| 6-322530 | 11/1994 | Japan | 204/298.13 |
| 7-278804 | 10/1995 | Japan . | |

OTHER PUBLICATIONS

John Dunlop et al., "Effects of Ti–W Target Processing Methods on Defect Generation During VLSI Device Fabrication", American Vacuum Society 37th Annual Symposium and Topical Conferences, Toronto, Canada, Oct. 8–12, 1990, 17 pages.

*Primary Examiner*—Patrick Ryan
*Assistant Examiner*—Jeffrey T. Knapp
*Attorney, Agent, or Firm*—Christie, Parker & Hale, LLP

[57] ABSTRACT

Described is a hot pressed and sintered sputtering target assembly formed of hot pressed and sintered metal powder diffusion bonded together and to a backing plate by use of an intermediate adhesion layer of titanium or titanium alloy.

9 Claims, 1 Drawing Sheet

HOT PRESSED AND SINTERED SPUTTERING TARGET ASSEMBLIES AND METHOD FOR MAKING SAME

FIELD OF THE INVENTION

The invention relates to sputtering target assemblies made by hot pressing metal powders. More particularly, the invention relates to a method of making a hot pressed and sintered sputtering target assembly that can be used for sputtering at much higher power levels than a solder-bonded assembly, thereby enabling a higher throughput in the sputtering process.

BACKGROUND OF THE INVENTION

Thin metallic and ceramic layers may be deposited upon a substrate by a process known as magnetron sputtering. In such a process, a sputtering target assembly is used that has a target surface of the material to be deposited. Magnetron sputtering and target assemblies used for sputtering, are well known.

Sputtering target assemblies typically include a target member supported on the backing plate. The target member includes a target surface of material to be sputtered. The backing member is intended to secure the target in place in a sputtering apparatus. Conventional methods of manufacturing target assemblies have included bonding a target member to a backing plate by TIG welding, brazing, soldering, and explosion bonding. TIG welding, brazing and explosion bonding are not low-temperature processes as is solder. They are, therefore, not subject to any temperature limitations on the target. TIG welding (or e-beam welding) have disadvantages of potential leaks and possible particle generation during sputtering and, in any case, these types of targets are typically not weldable. Explosion bonding is considered to be too expensive to be cost-effective. However, solder alloys typically used for joining the target to the backing plate by such methods have relatively low melting points and, therefore, cannot withstand high temperatures. The manufacturing cost of making conventional sputtering target assemblies is relatively high because of the many steps of the manufacturing process and the equipment required.

It is desirable to provide a more economical method of making sputtering target assemblies than the methods described above. It is also desirable to produce target assemblies capable of sputtering use at higher power levels than at which solder-bonded assemblies can be used to enable higher throughput of the sputtering process which, in turn, reduces cost of manufacturing articles that employ sputtering in their manufacture.

To avoid solder bonding, sputtering target assemblies can be advantageously made by powder metallurgical processes. One such process is disclosed in Mueller, U.S. Pat. No. 5,397,050, dated Mar. 14, 1995, which describes a method of producing a sputtering target assembly consisting of a tungsten-titanium alloy target attached to a titanium backing plate wherein a can containing a tungsten-titanium powder is consolidated to form a target. The can containing the powder is hot isostatic pressed to a titanium backing plate to form an interdiffusion-type bond between the target and the backing plate. However, since the process involves hot isostatic pressing powder contained within a can, it is relatively costly due to the use of expensive machining, canning and hot isostatic pressing procedures and equipment which add to manufacturing cost. In addition, because of the use of cannage there is a risk of entrapping gas which can cause voids in the product.

The present invention provides an efficient and relatively low cost method of producing sputtering target assemblies from powdered material by hot pressing without use of a container format so that gases are not entrapped. The method produces a sputtering target assembly with lower gas content and lower void levels which, in turn, results in lower particulate defects in the article, e.g., wafer, on which the sputtered material is deposited.

SUMMARY OF THE INVENTION

In accordance with the invention there is provided a method of making a hot pressed and sintered sputtering target assembly that is capable of sputtering use at higher power levels than at which soldered-bonded target assemblies of the same materials can be used. The method involves providing a layer of powdered titanium or titanium hydride which is capable of functioning as an intermediate adhesion layer between a target and a backing plate, in a suitable die and then providing powder of the material intended to form the target surface over the titanium or titanium hydride powder in the die. Thereafter, the powders are hot pressed and sintered under vacuum into a solid preform. The solid preform is diffusion bonded to a backing plate to form the sputtering target assembly.

More particularly, the invention comprises a method of making a hot pressed and sintered sputtering target assembly from metal powder comprising (a) providing powder titanium or powder titanium hydride in a die, providing over the powder of step (a) in the die a powder comprising: (1) a mixture of titanium hydride and tungsten, (2) titanium and tungsten powder, or (3) tungsten or tungsten alloy, or (4) titanium or titanium alloy, or (5) cobalt or cobalt alloy; (c) hot pressing and sintering the powder of steps (a) and (b) under vacuum into a solid preform; and (d) diffusion bonding the solid preform of step (c) to a backing plate to form a target assembly capable of use for sputtering at higher power levels than at which solder-bonded target assemblies of the same materials can be used.

The invention also comprises a hot pressed and sintered sputtering target assembly comprising a hot pressed and sintered target surface diffusion bonded to a backing plate with a hot pressed and sintered intermediate adhesion layer between the target surface and backing plate, the backing plate comprising aluminum, aluminum alloy, titanium or titanium alloy, said intermediate layer comprising titanium or titanium alloy, and said target surface comprising: (1) a mixture of titanium hydride and tungsten, or (2) tungsten or tungsten alloy, or (3) titanium and tungsten powder, or (4) titanium or titanium alloy, or (5) cobalt or cobalt alloy; said target assembly being capable of sputtering use at higher power levels than at which solder-bonded target assemblies of the same materials can be used.

Suitable powder intended for use as a target surface include mixtures of titanium hydride and tungsten, tungsten or tungsten alloy, titanium or titanium alloy, e.g., TiAl and TiAl$_3$, or cobalt or cobalt alloy. In the presently preferred embodiment, a powder mixture of titanium hydride and tungsten or an alloy of titanium and tungsten, is used to form the target surface. The backing plate preferably comprises aluminum, aluminum alloy, titanium or titanium alloy.

In an alternative embodiment, a sufficient amount, e.g. thickness, of titanium or titanium hydride may be used to form a backing plate itself. Thus, in this embodiment, the sputtering target comprises a hot pressed and sintered target surface, diffusion bonded directly to a titanium backing plate, in lieu of bonding to a separate backing plate structure with an intermediate adhesion layer of titanium, as previously described.

DETAILED DESCRIPTION

One embodiment of the sputtering target of the invention comprises a target of a titanium and tungsten alloy and a backing plate which may comprise aluminum, aluminum alloy, titanium or titanium alloy. An intermediate adhesion layer is employed between the target material and the backing plate to facilitate bonding of the target material to the backing plate. By this technique, a titanium and tungsten target can be produced by powder metallurgical processes wherein the target is diffusion bonded to the backing plate to form a diffusion bonded sputtering target assembly capable of use at much higher power levels than power levels of which solder-bonded target assemblies can be used. For example, a solder-bonded target with a 12-inch diameter target face can be sputtered at a practical maximum 3 kw power level and a target assembly of comparable size and composition made by powder metallurgical processes described herein can be operated at 6 kw or more, and has been used at power levels of 12 kw.

Figure 1:
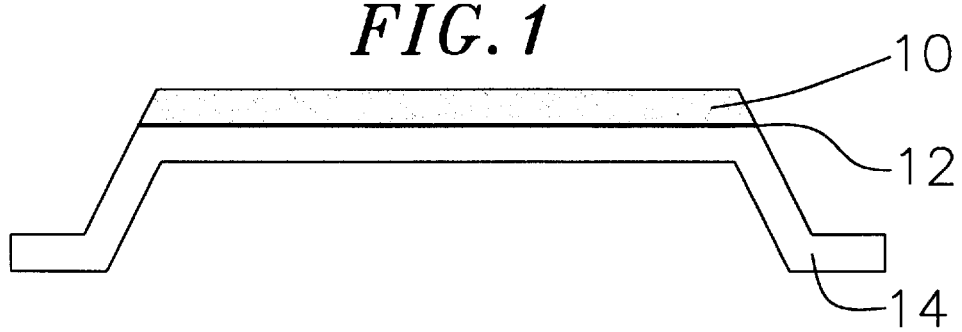
FIG. 1 is a diagrammatic cross-sectional view of the sputtering target assembly which may be produced in accordance with the invention.

Referring now to the drawings, FIG. 1 describes a target configuration comprising a target surface 10 which may be titanium-tungsten alloy, an intermediate adhesion layer 12, which may comprise titanium, and a backing plate 14 which may comprise aluminum or aluminum alloy, such as AL6061, AL7075, etc.

Figure 2:
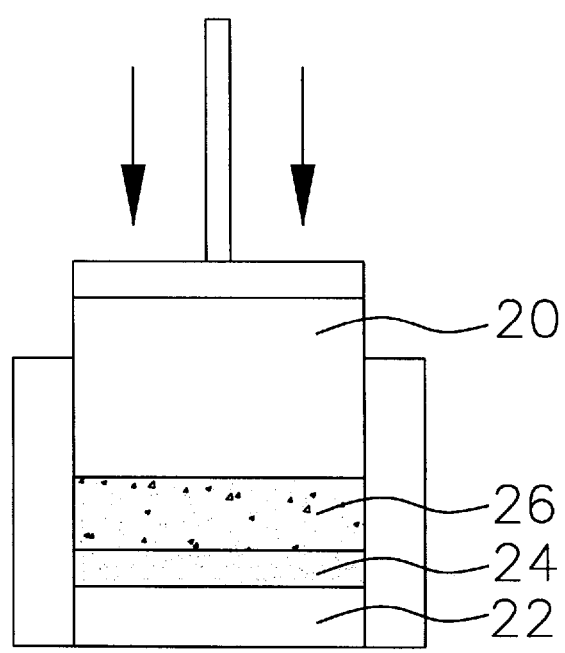
FIG. 2 is a diagrammatic view in cross section of a mold illustrating the method of the invention.

The diagrammatic view shown in FIG. 2 illustrates a suitable hot pressing apparatus, with heating means not shown, including a ram 20 and a mold bottom 22. The intermediate adhesion layer may be formed of powder titanium hydride 24 deposited at the bottom of the die, over which is disposed powder of the material intended to form the sputtering target surface, such as a mixture of titanium hydride and tungsten powder or just tungsten powder.

As an example, powder titanium or titanium hydride is loaded into the bottom of a hot pressing die to result in an adhesion layer of pure titanium of approximately 3 to 6 mm thickness. This powder is tamped down to produce a substantially flat surface. A mixture of titanium hydride and tungsten powder in the desired ratio to produce the desired titanium-tungsten target composition is then loaded into the die over the titanium or titanium hydride powder after which the die may be placed in a vacuum hot press, heated to between about 1300° C. to 1500° C., preferably 1340° C. to 1440° C., and pressed at 20 to 35 MPa of pressure (e.g. 3000 to 5000 psi) to press and sinter the powders into a solid preform. The preferred practice is to heat the powder to 1400° C. under a 21 MPa pressure for about one hour under vacuum. Above about 1500° C., the quality of the TiW is affected and the machinability is poor, limiting target finishing techniques to grinding only. Below about 1300° C., the TiW will not react in a reasonable amount of time and production efficiency is compromised. The resulting hot pressed and sintered preform may then be cooled, removed from the die and diffusion bonded to a backing plate, e.g., aluminum, by any suitable method.

The foregoing process simultaneously produces a titanium adhesion layer and titanium-tungsten target. The presence of the intermediate adhesion layer will greatly assist the bonding of the target material to a backing plate. Since the adhesion layer used for the diffusion bonding to the backing plate is formed at the same time as the target is formed, the efficiency of the manufacturing process is improved and the manufacturing cost is reduced. Moreover, as the target and the adhesion layer are in powder form, the diffusion kinetics are more favorable than for bonding a powder to a solid.

As indicated previously, an additional benefit of producing a hot pressed sputtering target assembly as described is that by hot pressing under vacuum, gases are not entrapped and, as a result, the target possesses a lower gas content and lower void level.

Although a particular example has been described with respect to a titanium-tungsten target, it is possible to substitute tungsten powder for the powder titanium hydride and tungsten mixture to make a tungsten target with a titanium adhesion layer that can then be diffusion bonded to a backing plate, e.g., aluminum backing plate. It is also possible to use a titanium adhesion layer as described for diffusion bonding a titanium-tungsten alloy target to a titanium backing plate. In addition, other target materials may be employed, such as tungsten alloys, e.g., tungsten-silicon alloys, titanium and titanium alloys, e.g., titanium-aluminum alloys, and cobalt and cobalt alloys such as cobalt-silicon alloys. The backing plate may comprise aluminum, aluminum alloys, titanium or titanium alloys.

It is also possible to make the hot pressed and sintered sputtering target assembly by employing a relatively thick layer of powder titanium hydride and/or titanium at the bottom of the die in an amount sufficient to make a full sized titanium backing plate.

It is apparent from the foregoing that various changes and modifications may be made without departing from the invention.

Accordingly, the invention should be limited only by the appended claims wherein what is claimed is:

1. A hot pressed and sintered sputtering target assembly comprising a hot pressed and sintered target surface diffusion bonded to a backing plate with a hot pressed and sintered intermediate adhesion layer between the target surface and backing plate, the backing plate comprising aluminum, aluminum alloy, titanium or titanium alloy, said intermediate layer comprising titanium or titanium alloy, and said target surface comprising: (1) a mixture of titanium hydride and tungsten, or (2) tungsten or tungsten alloy, or (3) titanium and tungsten powder, or (4) titanium or titanium alloy, or (5) cobalt or cobalt alloy; said target assembly being capable of sputtering use at higher power levels than at which solder-bonded target assemblies of the same materials can be used.

2. A hot pressed and sintered sputtering target assembly according to claim 1 wherein said target surface comprises TiAl or TiAl$_3$.

3. A method of making a hot pressed and sintered sputtering target assembly from metal powder comprising:
 (a) providing powder titanium or powder titanium hydride in a die;
 (b) providing over the powder of step (a) in the die a powder comprising: (1) a mixture of titanium hydride and tungsten, (2) titanium and tungsten powder, or (3) tungsten or tungsten alloy, or (4) titanium or titanium alloy, or (5) cobalt or cobalt alloy;
 (c) hot pressing and sintering the powder of steps (a) and (b) under vacuum into a solid preform; and
 (d) diffusion bonding the solid preform of step (c) to a backing plate to form a target assembly capable of use for sputtering at higher power levels than at which solder-bonded target assemblies of the same materials can be used.

4. A method according to claim 3 wherein said powder is pressed at about 3000 to 5000 psi to press and sinter the powders into a solid preform.

5. A method according to claim 3 wherein in step (c) the powder of steps (a) and (b) is heated to about 1300° C. to 1500° C.

6. A method according to claim 5 wherein the temperature is about 1340° C. to 1440° C.

7. A method according to claim 3 wherein the powder of step (b) comprises a mixture of titanium hydride and tungsten or a titanium and tungsten alloy.

8. A method according to claim 7 wherein the backing plate comprises aluminum, aluminum alloy, titanium or titanium alloy.

9. A method according to claim 8 wherein the backing plate is titanium formed by hot pressing and sintering powder titanium or titanium hydride in the same die.

* * * * *

UNITED STATES PATENT AND TRADEMARK OFFICE
CERTIFICATE OF CORRECTION

PATENT NO. : 5,863,398
DATED : January 26, 1999
INVENTOR(S) : Janine K. Kardokus; Diana Morales It is certified that error appears in the above-identified patent and that said Letters Patent is hereby corrected as shown below:

Column 4, line 46, after "tungsten" delete "powder".

Signed and Sealed this

Twenty-second Day of February, 2000

Attest:

Q. TODD DICKINSON

Attesting Officer

Commissioner of Patents and Trademarks